United States Patent [19]

Brodie et al.

[11] 4,274,143
[45] Jun. 16, 1981

[54] RECIRCULATING RMS AC CONVERSION METHOD AND APPARATUS

[75] Inventors: Benjamin T. Brodie; Henriecus Koeman, both of Edmonds, Wash.

[73] Assignee: John Fluke Mfg. Co., Inc., Mountlake Terrace, Wash.

[21] Appl. No.: 62,923

[22] Filed: Aug. 2, 1979

[51] Int. Cl.³ .......................................... G01R 15/10
[52] U.S. Cl. .................................... 364/483; 328/144; 324/132
[58] Field of Search .............. 364/483; 324/132, 106, 324/123 R; 328/144, 145; 307/230, 261, 151

[56] References Cited
U.S. PATENT DOCUMENTS

| | | | |
|---|---|---|---|
| 3,303,423 | 2/1967 | Staschover et al. | 324/106 |
| 3,384,805 | 5/1968 | Exworthy | 321/9 |
| 3,423,578 | 1/1969 | Platzer, Jr. et al. | 364/483 |
| 3,434,053 | 3/1969 | McKee | 324/132 |
| 3,488,482 | 6/1970 | Ley | 364/483 |
| 3,518,525 | 6/1970 | Duckworth et al. | 321/1.5 |
| 3,624,525 | 11/1971 | Smith | 328/144 |
| 3,723,845 | 3/1973 | Duckworth | 321/1.5 |
| 3,795,868 | 3/1974 | Ohme et al. | 328/144 |
| 3,845,388 | 10/1974 | Ley et al. | 324/106 |
| 3,911,359 | 10/1975 | Metcalf | 328/144 X |
| 3,911,359 | 10/1975 | Metcalf | 324/106 |
| 4,145,661 | 3/1979 | Wong | 324/132 X |

Primary Examiner—Edward J. Wise
Attorney, Agent, or Firm—Christensen, O'Connor, Johnson & Kindness

[57] ABSTRACT

A signal whose RMS value is to be accurately determined is first converted into DC form by a relatively inaccurate RMS converter, such as a thermal RMS converter (15). The result is a first converter signal ($Y_1$), which is stored for recirculation in a suitable device, such as a sample and hold circuit (17). The first converter signal is also doubled ($2Y_1$) and stored (41). Thereafter the first converter signal stored in the storage device is recirculated to the converter to create a second converter signal ($Y_2$). Then, the second converter signal is subtracted (43) from the doubled first converter ($2Y_1 - Y_2$) to produce a highly accurate RMS output signal.

21 Claims, 5 Drawing Figures

4,274,143

RECIRCULATING RMS AC CONVERSION METHOD AND APPARATUS

TECHNICAL AREA

This invention is directed to electronic conversion and, more particularly, to electronic conversion methods and apparatus for determining the root means square (RMS) value of an unknown signal.

BACKGROUND OF THE INVENTION

The ability to determine the RMS value of an unknown, e.g., AC signal with a high degree of accuracy is of critical importance in many environments. Presently, AC voltmeters provide accuracy to about 0.1% (1000 parts per million.) When higher accuracy is required, transfer standards are used. Transfer standards are used to measure the RMS value of an unknown AC signal by determining the difference between the RMS value of the unknown AC signal and a preset, accurately measured DC equivalent. While the use of transfer standards provides accuracy in the 100 parts per million (ppm) range, it has a number of disadvantages. First, the cost of the transfer standards test equipment required to achieve this accuracy is higher than desired. Secondly, and more importantly, the time required to make a transfer standards measurement having an accuracy in the 100 ppm range normally requires several (e.g. 5) minutes. As a result, the use of a transfer standards approach to determining the RMS value of a signal is both costly and time consumming. Thus, a need exists for an inexpensive measuring system for producing a signal that accurately represents the RMS value of an unknown AC signal.

Therefore, it is an object of this invention to provide a new and improved RMS conversion method and apparatus.

It is another object of this invention to provide a highly accurate RMS converter system.

It is a further object of this invention to provide a highly accurate RMS conversion method and apparatus that relatively rapidly converts an AC input signal into a DC signal having a magnitude proportional to the RMS value of the AC signal.

It is a still further object of this invention to provide a new and improved RMS converter system that relatively rapidly and quickly accurately determines the RMS value of an unknown AC signal.

While AC voltmeters and transfer standards have been utilized in the past to determine the RMS value of an unknown signal, other, less accurate and substantially less expensive, devices have been developed for converting an unknown AC signal into a DC signal having a magnitude that is equal to the RMS value of the AC signal. One form of such systems applies to AC signal to be converted to a first heating element such as a thermal resistor. The heat produced is thermally coupled to a suitable heat sensor, such as a transistor, which is connected in a differential circuit with a similar heat sensor. The differential output is utilized to control the DC power applied to a second heating element thermally coupled to the second heat sensor. At balance, the DC feedback voltage applied to the second heating element is equal to the RMS value of the unknown AC signal applied to the first heating element. Devices of this type having a conversion accuracy of 0.5% have been produced. Such a device is disclosed in U.S. patent application Ser. No. 842,972, filed Oct. 17, 1977 by Roy W. Chapel Jr. And I. Macit Gurol and entitled "Thermally Isolated Monolithic Semiconductor Die." While an accuracy of 0.5% (5000 ppm) is inadequate in many environments, these RMS converters have the advantage that they can be relatively inexpensively produced. Thus, it would be desirable to utilize such devices in more accurate RMS converter systems. Therefore, it is yet another object of this invention to provide a new and improved RMS converter system that utilizes relatively inexpensive thermal RMS converters.

SUMMARY OF THE INVENTION

In accordance with this invention a recirculating RMS AC conversion method and apparatus is provided. The signal whose RMS value is to be accurately determined is first converted into DC form by a relatively inaccurate RMS converter, such as a thermal RMS converter. The result is a first converter signal ($Y_1$), which is stored for recirculation in a suitable storage device, such as a sample and hold circuit. The first converter signal is also doubled ($2Y_1$) and the result stored for subsequent use. Next, the stored first converter signal is recirculated to the converter to create a second converter signal ($Y_2$). The second converter signal is then subtracted from the doubled first converter signal ($2Y_1 - Y_2$) to produce a highly accurate RMS output signal. The RMS output signal is highly accurate because signal errors present in the first and second converter signals are effectively cancelled as a result of the doubling and subtraction steps.

In one specific embodiment of the invention, the unknown (AC) signal is applied via a first switch to the input of a thermal RMS converter. The output of the thermal RMS converter is connected to an analog-to-digital converter and to the input of a sample and hold circuit. The output of the sample and hold circuit is connected to the input of the thermal RMS converter through a second switch. When the first switch is closed, the thermal RMS converter converts the unknown AC signal into a DC signal having a magnitude equal to the RMS value of the AC signal, plus some error. At this time the second switch is open and the sample and hold circuit is in its sample mode of operation. As a result, the sample and hold circuit stores the relatively inaccurate RMS value of the unknown signal produced by the thermal converter. After a sufficient time has elapsed for the thermal converter to stabilize, the output of the converter is converted from analog form to digital form by the analog-to-digital converter and the result is doubled and stored. Thereafter the first switch is opened and the second switch is closed. At the same time, the sample and hold circuit is switched from its sample mode of operation to its hold mode of operation. After a predetermined period of time, adequate for the thermal converter to stabilize, the output of the thermal converter is converted from analog form to digital form and the result subtracted from the stored digital signal equal to twice the first output of the thermal converter. The final result is a highly accurate digital RMS signal that can be used to control a suitable digital display, recorded on a suitable recording medium or applied to a suitable analyzing system.

It will be appreciated that the invention is ideally suited for use in an instrument for measuring the RMS value of unknown signals. When the invention is included in such an instrument, preferably, the first and second switches are sequentially alternated between the open and closed positions; and the sample and hold circuit is simultaneously placed in the required sample or hold mode state, depending upon the open/closed state of the first and second switches. Further, if the instrument is designed to perform other functions, such as DC voltage measurement, a combined controller can be utilized to control the switch open and closed states, the sample and hold mode of operation, storage, doubling, subtraction and display functions of the invention, as well as the functions of the other modes of operation of the composite instrument.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying wherein.

DESCRIPTION OF THE PREFERRED EMBODIMENTS

Figure 1:
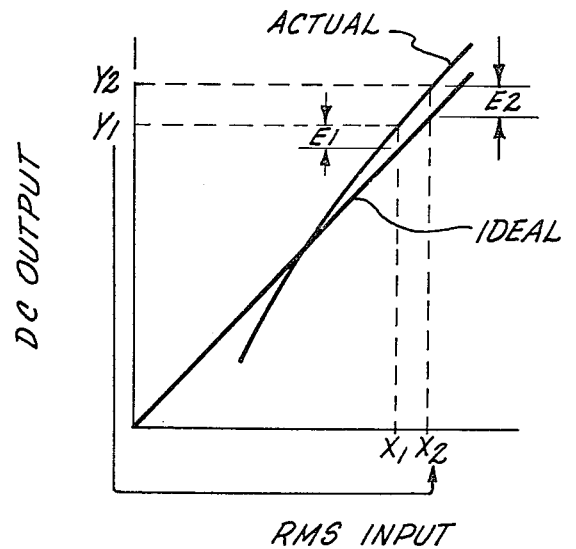
FIG. 1 is a graph utilized to describe the invention.

As will be better understood from the following description of the preferred embodiments of the invention, the present invention is based on sequentially applying first the unknown (AC) signal to a relatively inaccurate RMS converter; and, then, the output of the RMS converter obtained as a result of the application of the unknown AC signal to the RMS converter. The final RMS value is determined by doubling the first converter signal and subtracting from the doubled signal the second converter signal. FIG. 1 illustrates, and the following discussion describes, why this technique produces a highly accurate RMS output signal.

FIG. 1 is a graph illustrating the transfer curves of an ideal RMS converter and an actual (thermal) RMS converter. The abscissa or horizontal axis of the graph denotes the true RMS value of the input signal and the ordinate or vertical axis denotes the actual DC output. The ideal curve is, of course, a 45° line that bisects the coordinate system, because the DC output of an ideal converter is exactly equal to the RMS value of the input signal. The problem is that realizable RMS converters, such as thermal RMS converters, do not follow the ideal curve. Rather they follow a curve that is close, but not identical, to the ideal curve. An example of a thermal RMS converter curve, for a converter of the type described in U.S. Patent Application Ser. No. 842,972 referenced above, is illustrated in FIG. 1 and denoted "actual". As can be seen from FIG. 1, the actual curve shows that a signal having a true RMS value of $X_1$ produces an actual DC output of $Y_1$. The difference is an error $E_1$. That is, $X_1 = Y_1 - E_1$. Similarly, a second signal, having a true RMS value of $X_2$ produces an output signal $Y_2$. The difference is an error $E_2$. More specifically, $X_2 = Y_2 - E_2$. Alternatively, the foregoing equations can be represented as $Y_1 = X_1 + E_1$ and $Y_2 = X_2 + E_2$, respectively.

As discussed above, the invention is based on recirculating to the RMS converter an output signal obtained as a result of the conversion of an unknown AC signal. As a result, if $X_1$ is defined to equal the true RMS value of the unknown signal, $X_2$ can be set equal to $Y_1$. As also discussed above, in accordance with the invention, $Y_1$ is doubled and the value of $Y_2$ is subtracted from the doubled value of $Y_1$. Thus, the RMS value determined in accordance with the invention is computed based on the equation $X = 2Y_1 - Y_2$, where X is the resultant measured RMS value. Substituting the foregoing values for $Y_1$ and $Y_2$ results in the equation $X = 2(X_1 + E_1) - (X_2 + E_2)$. Since $X_2 = Y_1$, by definition, the value of $Y_1$ can be substituted for $X_2$ whereby this equation becomes $X = 2(X_1 + E_1) - (X_1 + E_1 + E_2)$. Cancellation of terms results in the equation $X = X_1 + E_1 - E_2$. Since the $Y_1$ and $Y_2$ voltages are relatively close to each other, $E_1$ and $E_2$ are very close to one another whereby X is substantially equal to $X_1$, which was originally defined as the actual RMS value of the input signal. It can be shown that the error is equal to twice the worst case error of the sensor squared. Thus, if the thermal sensor has a worst case accuracy of 0.5% (5000 ppm), the system accuracy is 50 ppm $[2(0.005)^2 = 0.000050]$.

Figure 2:
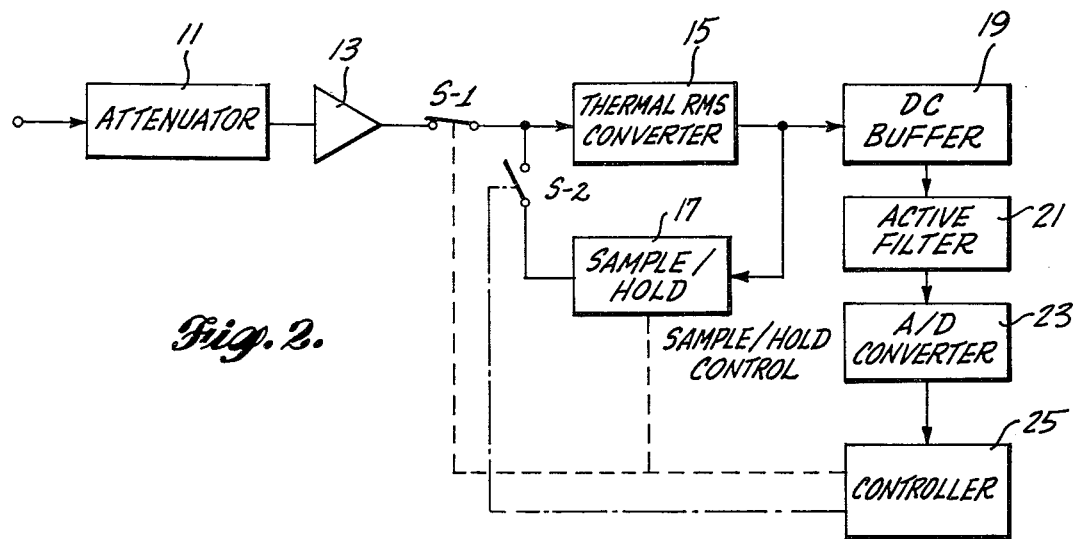
FIG. 2 is a block diagram of a preferred embodiment of the invention.

FIG. 2 illustrates a preferred embodiment of the invention and includes: an attenuator 11; a buffer amplifier 13; an thermal RMS converter 15; a sample and hold circuit 17; a DC buffer amplifier 19; an active filter 21; an analog-to-digital (A/D) converter 23; and, a controller 25. Also illustrated in FIG. 2 are first and second single pole switches designated S-1 and S-2. While S-1 and S-2 are illustrated as simple switches, as will be appreciated by those skilled in the electronics art, in an actual embodiment of the invention, these switches would be formed by semiconductor switches, such as field effect transistor switches, for example.

Figure 5:
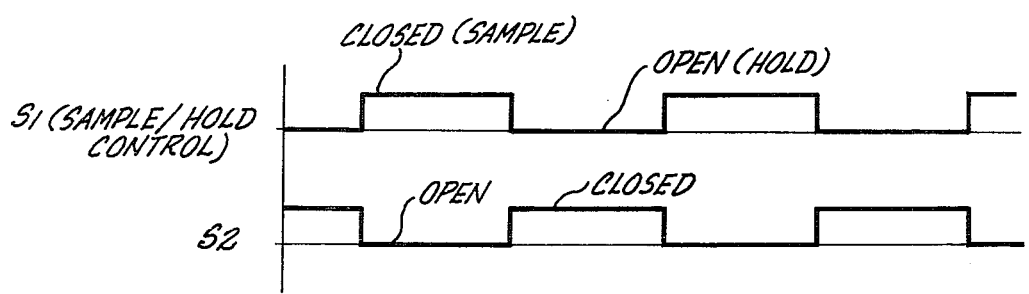

The unknown AC signal is applied via the attenuator 11 to the input of the buffer amplifier 13. The output of the buffer amplifier 13 is applied through S-1 to the input of the thermal RMS converter 15. The output of the thermal RMS converter 15 is applied to the input of the sample and hold circuit 17; and, the output of the sample and hold circuit 17 is applied through S-2 to the input of the thermal RMS converter 15. The output of the thermal RMS converter 15 is also applied through the DC buffer amplifier 19 and the active filter 21, connected in series, to the input of the A/D converter 23. The output of the A/D converter 23 is applied to the input of the controller 25. As illustrated by the dashed lines, the controller controls the opening and closing of S-1 and S-2; and, the mode of operation of the sample and hold circuit 17. S-1 and S-2 are alternately opened and closed. That is, as shown in FIG. 5, when S-1 is closed S-2 is opened and visa versa. In addition, when S-1 is closed (and S-2 is open) the sample and hold circuit 17 is placed in a sample mode of operation. Contrariwise, when S-1 is open (and S-2 is closed) the sample and hold circuit is placed in a hold mode of operation.

While various types of thermal RMS converters can be used by the invention, the thermal RMS converter preferred is one of the types described in U.S. Patent Application Ser. No. 842,972 filed Oct. 17, 1977 by Roy W. Chapel Sr. and I. Macit Gurol and entitled "Thermally Isolated Monolithic Semiconductor Die," and assigned to the assignee of the present invention. As necessary to an understanding of the present invention, the information contained in the U.S. Patent Application Ser. No. 842,972 is incorporated herein by reference. While the thermal RMS converter described in U.S. Pat. Application No. 842,972, is preferred, it will be appreciated that other thermal RMS converters can be used, as long as they have a relatively smooth transfer characteristic curve of the type generally illustrated by the actual curve in FIG. 1. Also, RMS converters other than thermal RMS converters can be utilized if they have a suitably smooth transfer characteristic curve. Further, while the device for temporarily storing the output of the thermal RMS is illustrated as a sample and hold circuit, obviously, other types of storage devices can be utilized if desired. In this regard, as will be understood from the following description of the operation of the embodiment of the invention, illustrated in FIG. 2, the controller receives the same data that is stored by the sample and hold circuit 17, except in digital form. The digital information stored by the controller could be converted from digital form to analog form and utilized to provide the same DC signal as that applied by the sample and hold circuit to the input of the thermal RMS converter when S-2 is closed.

Turning now to a description of the operation of the embodiment of the invention illustrated in FIG. 2; initially, S-1 is closed and S-2 is open; and, the sample and hold circuit is placed in a sample mode of operation. At this time, the unknown signal received by the attenuator 11 is applied through the buffer amplifier 13 to the input of the thermal RMS converter 15. The thermal RMS converter, in a conventional manner, produces a DC output signal whose magnitude is equal (or directly proportional) to the RMS value of the unknown signal, within a certain percent accuracy. This DC signal is stored by the sample and hold circuit 17. In addition, the DC output of the thermal RMS converter is buffered by the DC buffer 19, filtered by the active filter 21 and converted from analog form to digital form by the A/D converter 23. The resultant digital signal is applied to the controller 25. After a predetermined period of time, adequate for the output of the thermal RMS converter 15 to become stabilized (this usually occurs within 3 seconds or so), the controller reads the output of the A/D converter. Thereafter, the controller opens S-1 and closes S-2. At the same time, the sample and hold circuit is switched from a sample mode of operation to a hold mode of operation. Thereafter, the thermal RMS converter 15 converts the output of the sample and hold circuit. The new DC output of the thermal RMS converter is also buffered by the DC buffer 19 and filtered by the active filter 21. The output of the active filter is converted by the A/D converter 23 from analog form to digital form and the result (after the stabilization period) is read by the controller 25. Thereafter, the controller functions in accordance with the foregoing equation $(X=2Y_1-Y_2)$ to produce an accurate RMS output signal suitable for application to a display, recording medium or suitable signal analyzer.

Figure 3:
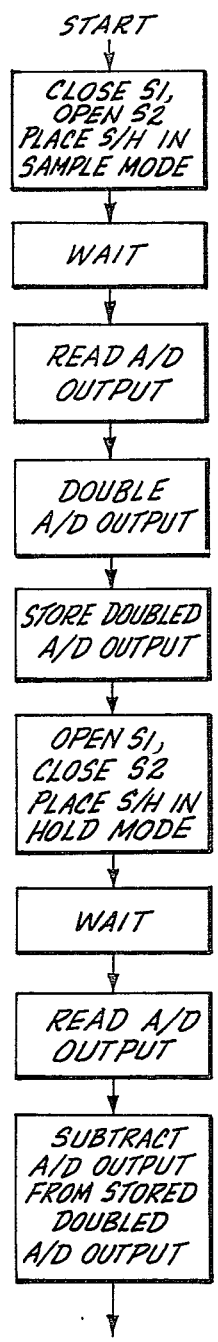
FIG. 3 is a flow diagram illustrating the operation of the controller illustrated in FIG. 2.

The controller can be formed in either of two generally different manners. For example, the controller may be a microprocessor programmed to function in accordance with the invention or it can be formed of discrete circuit elements. FIG. 3 is a flow diagram illustrating the programming of a microprocessor adapted to function in accordance with the invention; and, FIG. 4 is a block diagram illustrating one way of forming the controller from discrete circuit elements.

As shown in FIG. 3, at start, the microprocessor closes S-1, opens S-2 and places the sample and hold (S/H) circuit in a sample mode of operation. Thereafter, the microprocessor idles or waits for a predetermined period of time. After the lapse of this period of time, the output of the A/D converter is read. Thereafter, the output is doubled and, then, the doubled output is stored. Next, S-1 is opened, S-2 is closed and the sample and hold circuit is placed in a hold mode of operation. Thereafter, the microprocessor idles or waits for a predetermined period of time. After the period of time has elapsed, the output of the A/D converter is again read. The new output from the A/D converter is subtracted from the previously stored, doubled A/D converter output. The result is an accurate RMS output signal formed in accordance with the equation $X=2Y_1-Y_2$. Obviously the sequence illustrated in FIG. 3 is only an example of many different sequences that could be followed by a microprocessor. For example, the first A/D value could be stored until the second A/D value is received. Then the stored value could be doubled, followed by the subtraction step. Alternatively, rather than doubling the first A/D value, the second A/D value could be halved and subtracted from the first A/D value.

Figure 4:
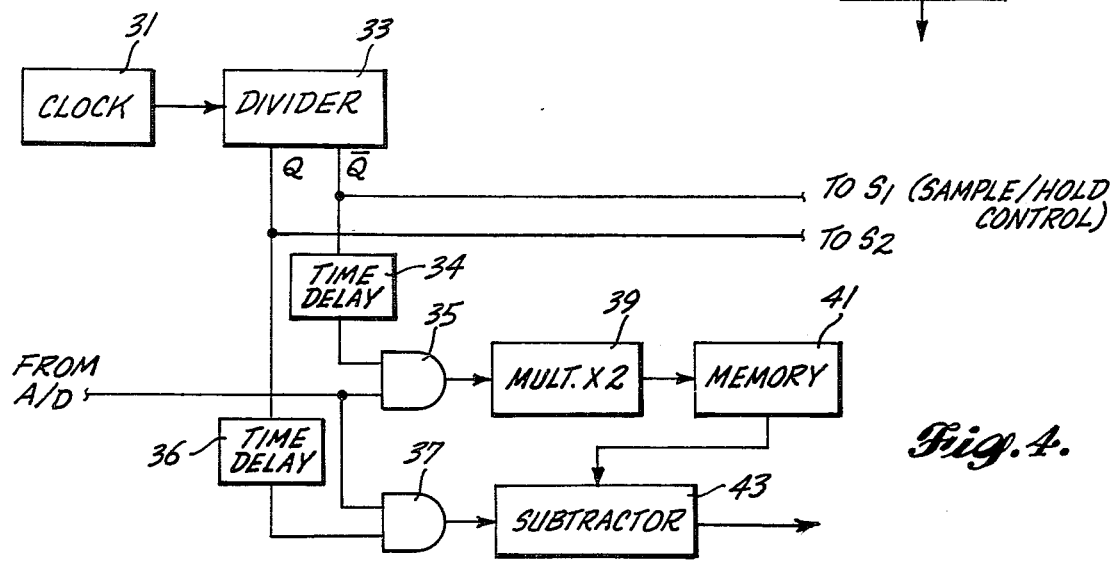
FIG. 4 is a block diagram of a controller suitable for use in the embodiment of the invention illustrated in FIG. 2; and, FIG. 5 is a timing diagram illustrating the opening and closing of the switches and the controlling of the sample and hold circuit included in the embodiment of the invention illustrated in FIG. 2.

The discrete circuit embodiment of a controller formed in accordance with the invention illustrated in FIG. 4 comprises: a clock 31; a divider 33; first and second time delays 34 and 36; first and second two-input AND gates 35 and 37; a multiply-by-two circuit 39; a memory 41; and, a subtractor 43. The clock 31 produces a train of pulses that are divided (e.g. counted) by the divider 33 to produce suitable complementary output control signals denoted Q and $\overline{Q}$. Q is applied to S-2 to control the open/closed state of S-2. By way of example, when Q is high, e.g. in a binary one state, S-2 is closed and when Q is low (binary zero state), S-2 is open. $\overline{Q}$ is applied to S-1 and to the sample/hold control input of the sample and hold circuit. Since $\overline{Q}$ is the complement of Q, it controls S-1 such that S-2 is open when S-2 is closed and visa versa. In addition, $\overline{Q}$ controls the samples and hold circuit so that the sample and hold circuit is in a sample mode of operation when S-1 is closed and in a hold mode of operation when S-1 is open.

The $\overline{Q}$ output of the divider 33 is also applied through the first time delay 34 to one input of the first AND gate 35 and the Q output of the divider 33 is applied through the second time delay 36 to one input of the second AND gate 37. The output from the A/D converter is applied to the other inputs of the first and second AND gates 35 and 37. The output of the first AND gate 35 is applied to the multiply-by-2 circuit 39 and the output of the multiply-by-2 circuit is applied to the memory 41. The output of the memory 41 is applied to the subtractor 43. The output of the second AND gate 37 is applied to the second input of the subtractor 43 and the RMS output signal occurs at the output of the subtractor.

In operation, it will be appreciated that the Q and $\overline{Q}$ outputs of the divider 33 control the delayed enabling of the first and second AND gates 33 and 37. Since the AND gates must be disabled when S-1, S-2 and the sample and hold circuit change states, it will be appreciated that the time delays only delay the leading edge of the Q and $\overline{Q}$ signals. As such, the time delays could be formed by delay elements and one-shots, fired after a suitable thermal RMS converter stabilization time period has elapsed. Alternatively, the time delays could be formed by counters enabled by the Q and $\overline{Q}$ signals. In any event, the first AND gate 35 is enabled a predetermined time period after the $\overline{Q}$ output of the divider 33 shifts high and is disabled when the $\overline{Q}$ output returns low. The second AND gate 37 is enabled a predetermined period of time after the Q output of the divider 33 shifts high and is disabled when the Q output returns low. During the period of time when the first AND gate 35 is enabled, the output from the A/D converter is applied to the multiply-by-2 circuit where it is multiplied by 2. The result is stored in the memory 41. This occurs when the thermal RMS converter is receiving the unknown AC signal. Sometime after the divider outputs switch states, the second AND gate is enabled, and as a result, the A/D converter output is applied to the subtractor 43. At the same time, the subtractor receives the output of the memory. In this regard, it should be noted that FIG. 4 is a simplified block diagram in that it does not illustrate the control for the various subsystems. For example, in an actual embodiment of the invention, the memory output would be timed to coincide with the subtractors receipt of the A/D converter signal. Timing has not been illustrated in FIG. 4 because the timing of digital electronic circuits is well known to those skilled in the electronics art. The subtractor, of course, subtracts the A/D converter signal from the memory signal to produce the desired accurate RMS signal.

As will be appreciated from the foregoing discussion, the invention provides a new and improved RMS converter system that is substantially more accurate than simple thermal RMS converters. More specifically, the accuracy of the output produced by the invention approaches the accuracy that can be produced utilizing a transfer standards approach to determining the RMS value of an unknown AC signal. The invention has the advantages of producing such a result at a substantially lower cost and much more rapidly than a transfer standards system.

While a preferred embodiment of the invention has been illustrated and described, it will be appreciated the various changes that can be made therein without departing from the spirit and scope of the invention. For example, as discussed above, since the controller 25 receives the same information as that stored in the sample and hold circuit, obviously, the digital signal stored in the controller can be used to control the production of a DC signal that can be used to form the recirculated second input to the thermal RMS converter. This can be done by dividing the stored output of the A/D converter by two (2) and applying the divided output to a D/A Converter. Or the first A/D output could be stored prior to doubling, the doubling occurring just prior to when the second A/D output is to be subtracted from the first (stored) A/D output. Thus a variety of different method step sequences and apparatus fall within the scope of the invention.

With respect to the sample and hold circuit, while various sample and hold circuits can be utilized, preferably, the sample and hold circuit chosen for use in an actual embodiment of the invention will produce an output having zero offset voltage error. (As will be recognized by those skilled in the electronics art most sample and hold circuits have an offset voltage, which creates an error in their output. One way of alieviating this problem is to subtract the offset voltage error from the resultant output. A more preferred way is to use a sample and hold circuit that has little or no offset voltage error.) A sample and hold circuit that produces an output having substantially zero offset voltage error is described in the U.S. Patent Application Ser. No. 062,922 entitled "Sample and Hold Circuit" by Ben Brodie, assigned to the assignee of the present invention and filed concurrently herewith on August 2, 1979. Alternatively, a storage circuit other than a sample and hold circuit can be included, if desired. Further, the recirculating converter system of the invention can form part of an overall controller in a test system designed to perform a variety of tests on electronic circuitry. including the determing of the RMS value of unknown signals. Hence, the invention can be practiced otherwise than as specifically described herein.

The embodiments of the invention in which an exclusive property or privilege is claimed are defined as follows:

1. A method of accurately determining the RMS value of an unknown signal comprising the steps of:
    (a) applying the unknown signal to an RMS converter having a relatively smooth transfer curve to produce a first converter signal;
    (b) recirculating said first converter signal back to said RMS converter to produce a second converter signal; and,
    (c) combining said first and second converter signals in accordance with the relationship $2Y_1 - Y_2$ to accurately determine the RMS value of the unknown signal, where $Y_1$ is directly related to said first converter signal and $Y_2$ is directly related to said second converter signal.

2. A method of accurately determining the RMS value of an unknown signal as claimed in claim 1 wherein said combining step comprises the substeps of:
    doubling the value of said first converter signal; and,
    subtracting said second converter signal from said doubled value of said first converter signal.

3. A method of accurately determining the RMS value of an unknown signal as claimed in claim 2 wherein said first converter signal is stored for a predetermined time period prior to being recirculated back to said RMS converter to produce said second converter signal.

4. A method of accurately determining the RMS value of an unknown signal as claimed in claim 3 wherein the doubled value of said first converter signal is stored while said first converter signal is being recirculated back to said RMS converter to produce said second converter signal.

5. A method of accurately determining the RMS value of an unknown signal as claimed in claim 4 wherein said first converter signal is converted from analog form to digital form prior to being doubled and stored; and, wherein said second converter signal is converted from analog form to digital form prior to being subtracted from said doubled value of said first converter signal.

6. A method of accurately determining the RMS value of an unknown signal is claimed in claim 1 wherein said first converter signal is stored for a predetermined time period prior to being recirculated back to said RMS converter to produce said second converter signal.

7. Apparatus for accurately determining the RMS value of an unknown signal comprising:
    (a) RMS conversion means having a relatively smooth transfer curve for converting an unknown signal into a DC signal proportional to the RMS value of the unknown signal;

(b) recirculating means connected to the output of said conversion means for recirculating the output of said conversion means back to the input of said conversion means;

(c) control means connected to said RMS conversion means and said recirculating means for controlling the application of signals to said RMS conversion means such that an input unknown signal and the output of said recirculating means are sequentially applied to said RMS conversion means; and, (d) combining means connected to said RMS conversion means for receiving the outputs of said RMS conversion means produced when said input unknown signal and the output of said recirculating means are sequentially applied to said RMS conversion means and combining said outputs in accordance with the relationship $2Y_1 - Y_2$ to accurately determine the RMS value of the unknown signal, where $Y_1$ is directly related to the output produced by said RMS conversion means when said input unknown signal is applied to said RMS conversion means $Y_2$ is directly related to the output produced by said RMS conversion means when said output of said recirculating means is applied to said RMS conversion means.

8. Apparatus for accurately determining the RMS value of an unknown signal as claimed in claim 7 wherein said combining means comprises:

doubling means connected to the output of said RMS conversion means for doubling the output of said RMS conversion means when said RMS means is receiving said input unknown signal; and, subtraction means connected to the output of said doubling means and to the output of said RMS conversion means for subtracting the output of said RMS conversion means from the output of said doubling means when said RMS conversions means is receiving the output of said recirculating means.

9. Apparatus for accurately determining the RMS value of an unknown signal as claimed in claim 8 wherein said RMS conversion means includes a thermal RMS converter.

10. Apparatus for accurately determining the RMS value of an unknown signal as claimed in claim 9 wherein said RMS conversion means also includes analog-to-digital conversion means connected to the output of said thermal RMS converter for converting the output of said thermal RMS converter from analog form to digital form.

11. Apparatus for accurately determining the RMS value of an unknown signal as claimed in claim 10 wherein said recirculating means includes a storage means connected to the output of said thermal RMS converter.

12. Apparatus for accurately determining the RMS value of an unknown signal as claimed in claim 11 wherein said storage means is a sample and hold circuit.

13. Apparatus for accurately determining the RMS value of an unknown signal as claimed in claim 12 wherein said control means includes a first switch connected between an input terminal and the input of said thermal RMS converter and a second switch connected between the output of said sample and hold circuit and the input of said thermal RMS converter and a controller for controlling the open and closed states of said first and second switches, such that they are in opposite states.

14. Apparatus for accurately determining the RMS value of an unknown signal as claimed in claim 13 wherein said controller also controls said sample and hold circuit such that said sample and hold circuit is in its sample mode of operation when said first switch is closed and said second switch is open, and is in its hold mode of operation when said first switch is open and said second switch is closed.

15. Apparatus for accurately determining the RMS value of an unknown signal as claimed in claim 14 wherein:

said doubling means comprises a multiplying means suitable for connection to the output of said analog-to-digital converter means for doubling the output of said analog-to-digital converter means and a memory for storing the doubled value; and, said subtraction means comprises a subtractor connected to receive the doubled value stored in said memory and the output of said analog-to-digital converter means occurring when the output of said sample and hold circuit is connected to the input of said thermal RMS converter.

16. Apparatus for accurately determining the RMS value of an unknown signal as claimed in claim 7 wherein said RMS conversion means includes a thermal RMS converter.

17. Apparatus for accurately determining the RMS value of an unknown signal as claimed in claim 16 wherein said RMS conversion means also includes analog-to-digital conversion means connected to the output of said thermal RMS converter for converting the output of said thermal RMS converter from analog form to digital form.

18. Apparatus for accurately determining the RMS value of an unknown signal as claimed in claim 7 wherein said recirculating means includes a storage means connected to the output of said thermal RMS converter.

19. Apparatus for accurately determining the RMS value of an unknown signal as claimed in claim 18 wherein said storage means is a sample and hold circuit.

20. Apparatus for accurately determining the RMS value of an unknown signal as claimed in claim 7 wherein said control means includes a first switch connected between an input terminal and the input of said RMS conversion means and a second switch connected between the output of said recirculating means and the input of said RMS conversion means and a controller for controlling the open and closed states of said first and second switches, such that they are in opposite states.

21. Apparatus for accurately determining the RMS value of an unknown signal as claimed in claim 20 wherein said recirculating means includes sample and hold modes of operation and said controller also controls said recirculating means such that said recirculating means is in a sample mode of operation when said first switch is closed and said second switch is open and is in a hold mode of operation when said first switch is open and said second switch is closed.

* * * * *

UNITED STATES PATENT AND TRADEMARK OFFICE
CERTIFICATE OF CORRECTION

PATENT NO. : 4,274,143
DATED : June 16, 1981
INVENTOR(S) : Ben Brodie and Riekus Koeman It is certified that error appears in the above-identified patent and that said Letters Patent are hereby corrected as shown below:

Claim 18, line 2 cancel "7" and insert —17—.

Signed and Sealed this

First Day of March 1983

[SEAL]

Attest:

GERALD J. MOSSINGHOFF

*Attesting Officer*  *Commissioner of Patents and Trademarks*